(12) United States Patent
Kumano et al.

(10) Patent No.: US 11,231,994 B2
(45) Date of Patent: Jan. 25, 2022

(54) MEMORY SYSTEM AND METHOD OF CONTROLLING NONVOLATILE MEMORY

(71) Applicant: TOSHIBA MEMORY CORPORATION, Minato-ku (JP)

(72) Inventors: Yuta Kumano, Kawasaki (JP); Hironori Uchikawa, Fujisawa (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 324 days.

(21) Appl. No.: 16/299,376

(22) Filed: Mar. 12, 2019

(65) Prior Publication Data

US 2020/0081774 A1    Mar. 12, 2020

(30) Foreign Application Priority Data

Sep. 10, 2018   (JP) .............................. JP2018-169049

(51) Int. Cl.
*G06F 11/10*   (2006.01)
*H03M 13/15*   (2006.01)
*H03M 13/29*   (2006.01)
*G11C 29/52*   (2006.01)

(52) U.S. Cl.
CPC .......... *G06F 11/1068* (2013.01); *G11C 29/52* (2013.01); *H03M 13/1515* (2013.01); *H03M 13/2906* (2013.01)

(58) Field of Classification Search
CPC ............ G06F 11/1068; G06F 11/1012; H03M 13/1515; H03M 13/2906; H03M 13/2963; H03M 13/152; H03M 13/1102; G11C 29/52; G11C 2029/0411
See application file for complete search history.

(56) References Cited

U.S. PATENT DOCUMENTS

| 8,418,042 B2* | 4/2013 | Kanno .................. H03M 13/29 714/784 |
| 9,588,841 B2* | 3/2017 | Lei .......................... G11C 5/143 |
| 9,940,194 B2* | 4/2018 | Achtenberg .......... G06F 3/0619 |
| 2018/0159560 A1 | 6/2018 | Sharon et al. |

FOREIGN PATENT DOCUMENTS

JP   5017407   9/2012

* cited by examiner

*Primary Examiner* — April Y Blair
*Assistant Examiner* — Rong Tang
(74) *Attorney, Agent, or Firm* — Oblon, McClelland, Maier & Neustadt, L.L.P.

(57) ABSTRACT

According to one embodiment, a memory system includes a nonvolatile memory, and a memory controller. Each of first storage regions of each of the nonvolatile memory includes a plurality of second storage regions. Each of pieces of first data includes pieces of second data as storage target data. Third data includes pieces of the second data that are selected one by one from each of the pieces of first data. The memory controller executes first decoding of decoding each of the pieces of first data on the basis of a first error correcting code generated by using the first data, and executes second decoding of decoding the third data including a bit of which reliability, which relates to each bit in each of the second storage regions that fail in the first decoding, is less than reliability of other bits on the basis of a second error correcting code.

17 Claims, 8 Drawing Sheets

MEMORY SYSTEM AND METHOD OF CONTROLLING NONVOLATILE MEMORY

CROSS-REFERENCE TO RELATED APPLICATIONS

This application is based upon and claims the benefit of priority from Japanese Patent Application No. 2018-169049, filed on Sep. 10, 2018; the entire contents of which are incorporated herein by reference.

FIELD

Embodiments described herein relate generally to a memory system.

BACKGROUND

A defective memory block, which is caused by a deviation in manufacturing conditions, exists in a chip of a solid state drive (SSD). It is possible to enhance reliability of writing data on SSD by protecting data that is written in a page unit including a plurality of memory cells of each chip with error correcting codes (ECC) and by composing redundant arrays of inexpensive disks (RAID) by using a plurality of pages extracted from another chip.

DETAILED DESCRIPTION

In general, according to one embodiment, a memory system includes a nonvolatile memory and a memory controller. Each of the nonvolatile memory includes a plurality of first storage regions. Each of the first storage regions includes a plurality of second storage regions. Each of pieces of first data includes pieces of second data as storage target data. Third data includes pieces of second data that are selected one by one from each of the pieces of first data. The pieces of second data that are included in the third data do not overlap pieces of second data that are included in another piece of third data. The memory controller executes first decoding of decoding each of the pieces of first data on the basis of a first error correcting code that is generated by using the first data, calculates reliability of each bit in each of the second storage regions that fail in the first decoding, and executes second decoding of decoding the third data that includes a bit of which reliability is less than reliability of other bits by using a second error correcting code that is generated by using the third data.

Hereinafter, the memory system according to the embodiment will be described in detail with reference to the accompanying drawings. Furthermore, the invention is not limited by the following embodiment.

First, an example of the nonvolatile memory to which this embodiment is applied will be described. The nonvolatile memory to which this embodiment is applicable is, for example, a NAND-type flash memory (hereinafter, referred to simply as "NAND memory"). In the following description, a case where the NAND memory is used as the nonvolatile memory is exemplified, but a storage device such as a three-dimensional structure flash memory, a resistive random access memory (ReRAM), and a ferroelectric random access memory (FeRAM) other than the NAND memory can also be used as the nonvolatile memory. In addition, it is not necessary for the nonvolatile memory to be a semiconductor memory, and this embodiment is applicable to various storage media other than the semiconductor memory.

In the NAND memory, typically, writing and reading are performed in a unit (second storage region) called a page, and erasing is performed in a unit (first storage region) called a block including a plurality of pages. The NAND memory includes a plurality of the blocks.

In the SSD using the NAND memory and the like, as described above, it is possible to enhance reliability of writing data by the ECC and the RAID. However, in a case where a lot of defective memory blocks exist and in a case where a random bit error rate is large, page restoration may fail in decoding of the ECC, and data restoration may fail in decoding of the RAID in some cases.

For example, when composing the RAID by using a single parity check (SPC) code, in a case where decoding fails in one page, it is possible to restore the page (decoding failure page) that fails in the decoding by taking exclusive OR of other pages that succeed in decoding. On the other hand, in a case where decoding fails in two or more pages, it is difficult to restore the decoding failure pages.

In addition, for example, in a case of composing the RAID by using a reed-solomon (RS) code of which the number of parity symbols is 2, when decoding fails in two or less pages, it is possible to restore the decoding failure pages through bounded distance decoding or erasure correction. On the other hand, in a case where decoding fails in three or more pages, only one symbol error included in each frame of the RS code can be corrected.

In this embodiment, a bit position with a high error probability in a decoding failure page is estimated by using a read value that is read by soft-decision (soft-decision read value) or a posteriori value that is obtained through soft-decision decoding, and decoding of the RAID is executed by using the estimated information. According to this, it is possible to further improve decoding performance in comparison to the related art. Furthermore, details of conditions of determination as decoding failure will be described later.

For example, in a case of composing the RAID by using the SPC code, even in a case where decoding fails in two or more pages, correction may be possible when applying this embodiment, and thus it is possible to improve the decoding performance. In addition, in a case of composing the RAID by using the RS code of which the number of parity symbols is 2, when applying this embodiment, it is possible to correct two-symbol error included in each frame of the RS code. According to this, it is possible to improve performance of decoding of the ECC and repetitive decoding in the RAID.

Figure 1:
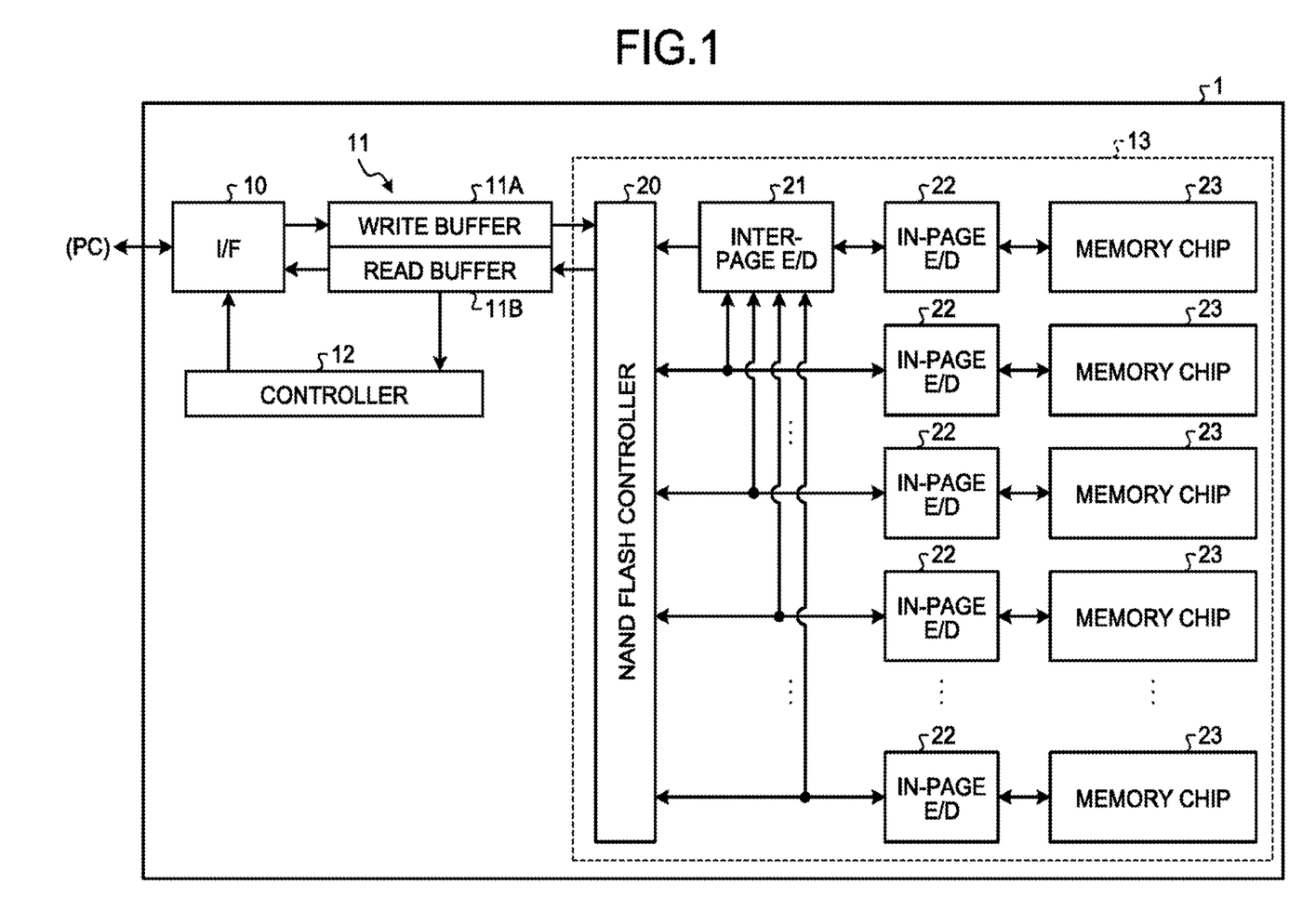
FIG. 1 is a view illustrating a configuration of an example of a memory system that is applicable to an embodiment.

FIG. 1 illustrates a configuration of an example of a memory system 1 to which an embodiment of the invention is applicable. In the example illustrated in FIG. 1, the memory system 1 includes an interface (I/F) 10, a buffer memory 11, a controller 12, and a flash memory unit 13.

For example, the interface 10 is an interface between an information processing apparatus such as a personal computer (PC) that becomes a host of the memory system 1 and the memory system 1. As the interface 10, for example, a serial advanced technology attachment (SATA) standard is applicable. The buffer memory 11 includes a write buffer 11A and a read buffer 11B. The write buffer 11A is a buffer region for storage data to be stored in the flash memory unit 13. The read buffer 11B is a buffer region for read data that is read from the flash memory unit 13. For example, the controller 12 includes a central processing unit (CPU), controls the interface 10 and the buffer memory 11, and adjusts a speed of storage of data in the flash memory unit 13 or reading of data from the flash memory unit 13.

The flash memory unit 13 includes a NAND flash controller 20 and a plurality of memory chips 23, and includes a plurality of in-page encoder/decoder (E/D) units 22 corresponding to the memory chips 23. The flash memory unit 13 further includes an inter-page encoder/decoder (E/D) unit 21. The memory chip 23 stores information in a plurality of memory cells included in a chip by substituting the information with a charge.

The NAND flash controller 20 controls storage and reading of data with respect to each of the memory chips 23. In addition, the NAND flash controller 20 controls an operation of the in-page E/D unit 22 and the inter-page E/D units 21.

For example, the NAND flash controller 20 includes a memory, and when a predetermined amount of data is collected in the write buffer 11A in data storage, the NAND flash controller 20 reads out data corresponding to a storage unit of the memory chip 23 from the write buffer 11A and stores the data in the memory. The data read from the memory is supplied to the in-page E/D unit 22 and is error correction encoded, and is stored in the memory chips 23 through control of the NAND flash controller 20.

In storage processing, the inter-page E/D unit 21 performs error correction encoding using an error correcting code (inter-page code) with respect to input data. In addition, in read processing, the inter-page E/D unit 21 decodes the error correcting code of the input data, and performs error correction processing with respect to the data. For example, the inter-page E/D unit 21 includes a memory that stores data that is an encoding and decoding target, and performs error correction encoding processing, error correction processing, and the like by using data that is stored in the memory.

In storage processing, the in-page E/D unit 22 generates a cyclic redundancy check (CRC) code with respect to the input data, and performs error correction encoding using the error correcting code (in-page code) with respect to the data and the CRC code that is generated. In addition, in read processing, error correction is performed by decoding the error correcting code of the input data, and decodes the CRC code to obtain an error position. For example, the in-page E/D unit 22 includes a memory that stores data that becomes an encoding and decoding target, and performs the error correction encoding processing, error correction processing, and the like by using the data that is stored in the memory. A code that is used in the error correction is not limited to the CRC code, and another code may be used instead of the CRC code.

The memory system 1 may include the interface 10, the buffer memory 11, a memory controller, and the memory chips 23, and the memory controller may be configured to include the controller 12, the NAND flash controller 20, the inter-page E/D unit 21, and the in-page E/D unit 22. In addition, the buffer memory 11 may be configured to be embedded in the memory controller.

Figure 2:
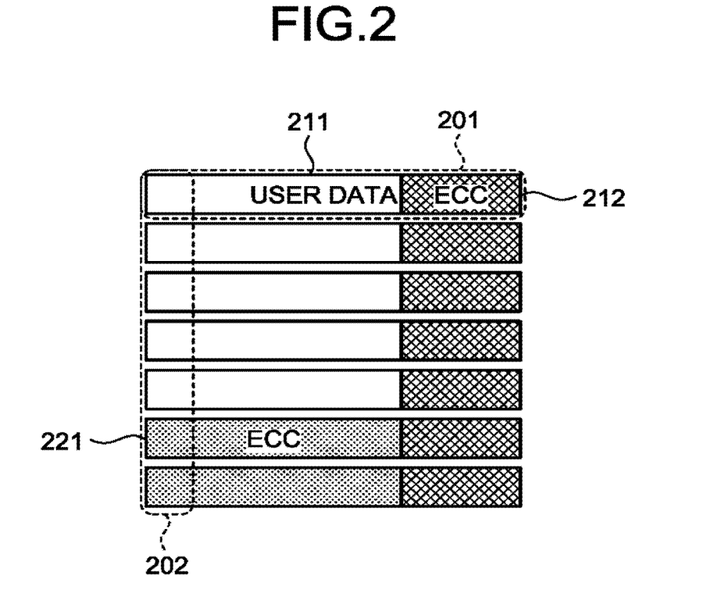
FIG. 2 is a view illustrating a configuration example of an RAID.

FIG. 2 is a view illustrating a configuration example of the RAID. A page 201 includes user data 211, and an ECC 212 that is generated from the user data. Data to be encoded may include control data that is used at the inside of the controller 12, and the like in addition to the user data.

The user data 211 (first data) that is stored in each page is protected by the ECC 212 (first error correcting code) that is generated by using the user data. The user data 211 that is stored in the page includes pieces of data (second data) as storage target data. For example, a portion in which two regions surrounded by a broke line in FIG. 2 overlap each other corresponds to one of the pieces of data (second data).

Hereinafter, an ECC that protects user data stored in each page is referred to as an in-page code. Examples of the in-page code include an algebraic code such as a Bose-Chaudhuri-Hocquenghem (BCH) code and an RS code, a code such as a low density parity check (LDPC) code based on a sparse graph, and a product code and a concatenated code thereof.

Respective pieces of the user data that are stored in a plurality of pages are protected by an ECC 221 (second error correcting code) different from the in-page code. Hereinafter, the ECC 221 is referred to as an inter-page code. The inter-page code is an algebraic code such as an SPC code, the BCH code, and the RS code.

The inter-page code is generated by using data (third data) including one of pieces of data (second data) that are selected from the plurality of pages. Data 202 in FIG. 2 represents a data unit that is protected by the inter-page code. Although not illustrated in FIG. 2, data units that are protected by the inter-page code are arranged in a column direction in FIG. 2 as in the data 202. For example, in a case of the RS code, each frame corresponds to the data unit that is protected by the inter-page code.

With regard to each data unit, the inter-page code is generated by using pieces of data (third data) that are different from each other. In other words, data (second data) that is included in data (third data) corresponding to an arbitrary data unit and is selected from a plurality of pages does not overlap data (second data) that is included in data (third data) corresponding to another data unit and is selected from the plurality of pages.

Furthermore, FIG. 2 illustrates an example in which the user data 211 and the ECC 212 with respect to the user data 211 are stored in one page, in other words, an example in which data corresponding to one row in FIG. 2 is stored in one page. The unit corresponding to the one row is not limited thereto. For example, one ECC may be generated with respect to pieces of user data that correspond to a plurality of pages, and the pieces of user data and the generated ECC may be stored in a storage region corresponding to the plurality of pages. In addition, one ECC may be generated with respect to user data corresponding to less than one page, and the user data and the generated ECC may be stored in a storage region corresponding to less than one page.

Hereinafter, decoding of the in-page code with respect to an arbitrary page is referred to as "in-page decoding", and decoding of the inter-page code with respect to a plurality of pages is referred to as "inter-page decoding".

In FIG. 1, the inter-page E/D unit 21 executes encoding of the inter-page code, and decoding (inter-page decoding) of the inter-page code. In addition, the in-page E/D unit 22 executes encoding of the in-page code, and decoding of the in-page code (in-page decoding). For example, each of the memory chips 23 is a memory chip that stores data corresponding to one row in FIG. 1.

Here, decoding failure conditions of the in-page code will be defined. First, when the user data is protected by the CRC, a case where CRC check is not passed is defined as decoding failure. In addition, when the user data is protected by the BCH code or the RS code, a case where syndrome check is not passed after performing correction processing, that is, in a case where syndrome does not become zero is defined as the decoding failure. In addition, when bounded distance decoding is used as a decoding method, for example, a case where the number of roots that are found and the degree of an error position polynomial are different from each other is defined as the decoding failure.

In addition to the above-described contents, the decoding failure conditions will be further defined. First, when the in-page code is set as a product code, a case where component codes for which syndrome check is not passed after performing correction processing exist is defined as the decoding failure. Here, the component codes are individual codes in a row direction and a column direction that constitute a product code. In addition, when the in-page code is set as an LDPC code, a case where the syndrome check is not passed after performing correction processing is defined as the decoding failure.

Figure 3:
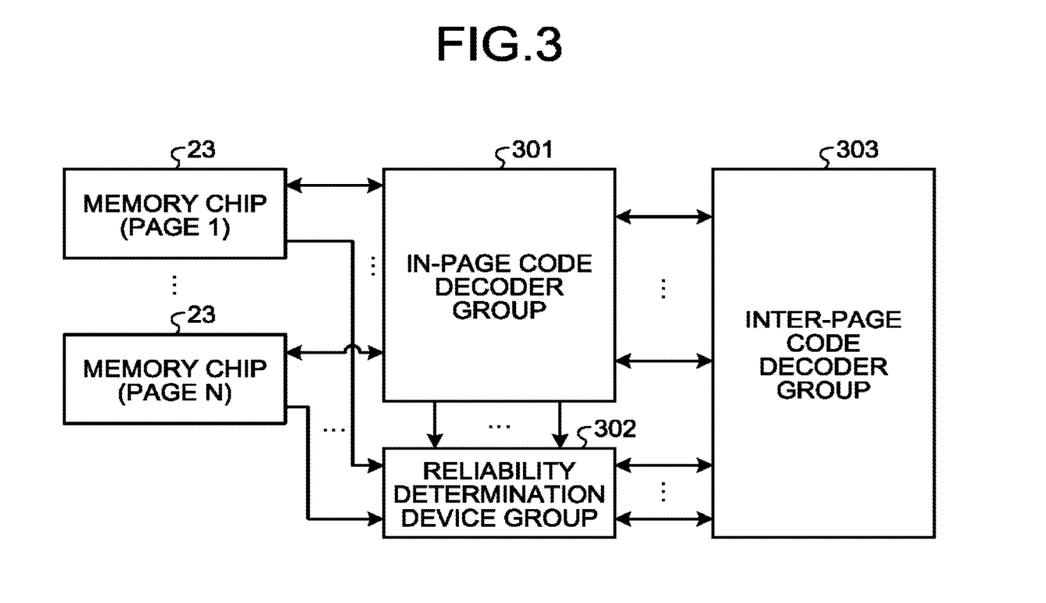
FIG. 3 is a block diagram illustrating a function related to decoding.

FIG. 3 is a block diagram illustrating a function related to decoding in the memory system 1. Data corresponding to each page of the RAID illustrated in FIG. 2 is written in each of the memory chips 23.

An in-page code decoder group 301 is an assembly of decoders that execute in-page decoding of respective pages. For example, the plurality of in-page E/D units 22 in FIG. 1 correspond to the in-page code decoder group 301. Each of decoders included in the in-page code decoder group 301 performs the in-page decoding by setting a read value from a corresponding memory chip 23, or an output from an inter-page code decoder group 303 to be described later as an input. The function of the decoders of the in-page code decoder group 301 may be provided in one decoder.

In a case of succeeding in the in-page decoding, each of the decoders outputs a bit sequence obtained as a result of the decoding, and writes the bit sequence, for example, in a memory that is provided in the decoder. In a case of failing in the in-page decoding, the decoder outputs an input to the decoder or a bit sequence obtained as a result of the decoding.

A reliability determination device group 302 is an assembly of determination devices that determine (calculate) reliability of each bit in the page in a case where decoding of the corresponding page fails. For example, the plurality of in-page E/D units 22 in FIG. 1 may have a function of the determination devices. A plurality of determination devices corresponding to the memory chips 23 may be provided separately from the plurality of in-page E/D units 22. One determination device may have a function of the determination devices of the reliability determination device group 302. The determination devices determine reliability of each bit with respect to a decoding failure page (failure region). An input and an operation of the determination device will be described later.

The inter-page code decoder group 303 is an assembly of decoders that restore the decoding failure page through inter-page decoding. For example, the inter-page E/D unit 21 in FIG. 1 corresponds to the inter-page code decoder group 303. In FIG. 1, one piece of the inter-page E/D unit 21 is provided. However, for example, a plurality of inter-page E/D units that execute inter-page decoding for every data unit may be provided. In this case, the plurality of inter-page E/D units correspond to the inter-page code decoder group 303.

Each decoder included in the inter-page code decoder group 303 restores a decoding failure page through the inter-page decoding by setting an output of the in-page code decoder group 301 and an output of the reliability determination device group 302 as an input. One decoder may have a function of respective decoders of the inter-page code decoder group 303. A specific operation of the inter-page code decoder group 303 will be described later.

Next, an operation of the reliability determination device group 302 will be described. The reliability determination device group 302 determines reliability of each bit of the decoding failure page by one of the following two methods. Here, a bit with low reliability represents that an error probability of the bit is high.

(Determination Method 1) Method Using Soft-Decision Read Value

Figure 4:
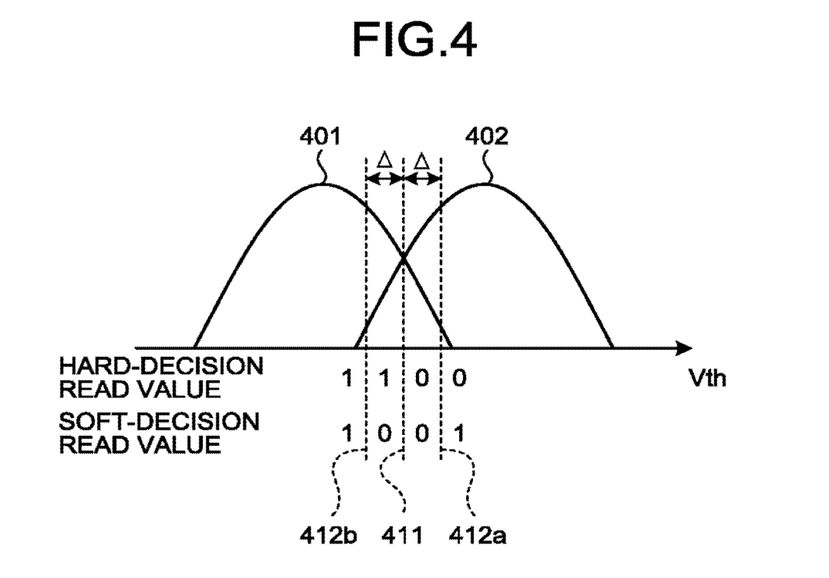
FIG. 4 is a view illustrating an example of soft-decision reading-out when using an SLC method.

A determination device determines reliability with respect to the decoding failure page by setting a soft-decision read value as a parameter for every bit. FIG. 4 is a view illustrating an example of the soft-decision read when using a single level cell (SLC) method that stores one bit in one memory cell.

A curve 401 represents a distribution of a threshold voltage corresponding to writing data "1", and a curve 402 represents a distribution of a threshold voltage corresponding to writing data "0". A broken line 411 represents a hard-decision read level. Broken lines 412a and 412b represent a soft-decision read level that is a read level at a position deviates by $\pm\Delta$ on the basis of the hard-decision read level.

The determination device executes the soft-decision read with respect to each soft-decision read level. The determination device determines reliability of a bit as "0" in a case where the soft-decision read value is "0", and determines the reliability of the bit as "1" in a case where the soft-decision read value is "1".

Hereinafter, a bit of which reliability is "0" may be referred to as low-reliability bit, and a bit of which reliability is "1" may be referred to as a high-reliability bit. Here, $\Delta$ is a threshold value that is set in advance, and a different value may be used in accordance with the number of decoding failure pages. That is, the soft-decision read may be executed by using a read level that is different in accordance with the number of the decoding failure pages. A method of determining $\Delta$ will be described later.

In addition, the reliability is not limited to the example in which the reliability is expressed by one bit. For example, a plurality of threshold values $\Delta$ may be set, and the reliability may be expressed by a width of two or more bits. In this case, a bit with the predetermined threshold value or less is referred to as a low-reliability bit, and the other bits are referred to as a high-reliability bit.

Description has been given of read in the SLC, but in a multi-level cell (MLC), a triple-level cell (TLC), a quad-level cell (QLC), and the like in which two or more bits are stored in one memory cell, the hard-decision read value and the soft-decision read value can be defined in a similar manner.

(Determination Method 2) Method Using Posteriori Value

Reliability is determined with respect to the decoding failure page by setting a posteriori value as a parameter for every bit. For example, the posteriori value is a log-likelihood-ratio (LLR) that is a natural logarithm of a ratio between a posteriori probability in which a bit is "0" and a posteriori probability in which a bit is "1". In this case, it is assumed that in the in-page code decoder group 301, soft-decision decoding is executed, and a posteriori value of each bit of the decoding failure page is obtained. Furthermore, an input with respect to a decoder that executes soft-decision decoding (soft-decision decoder) may be either a hard-decision read value of writing data or a soft-decision read value.

Figure 5:
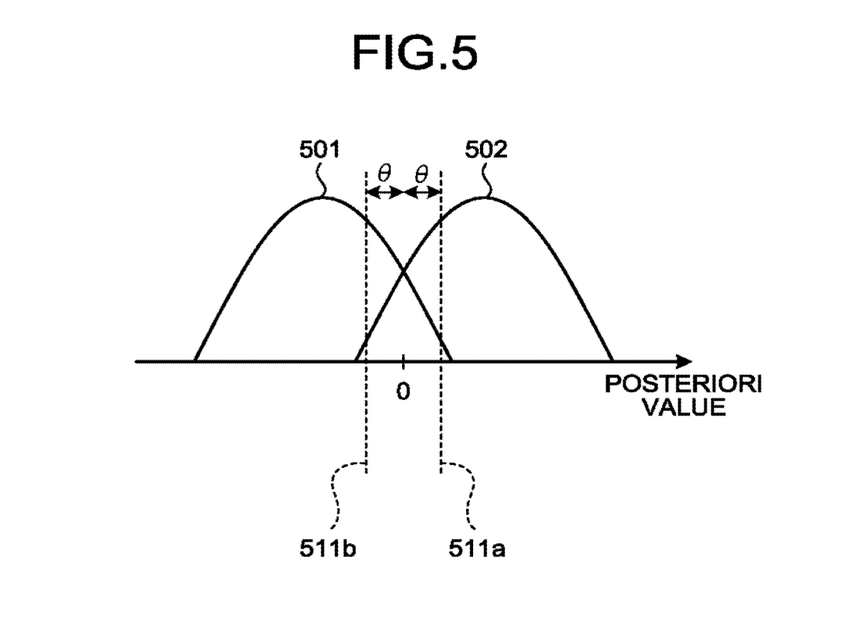
FIG. 5 is a view illustrating an example of a distribution of a posteriori value of a decoding failure page.

FIG. 5 is a view illustrating an example of a distribution of a posteriori value of the decoding failure page. A curve 501 represents a distribution of a posteriori value corresponding to writing data "1", and a curve 502 represents a distribution of a posteriori value corresponding to writing data "0". Broken lines 511a and 511b represent a determination line at a position deviates by ±θ on the basis of a posteriori value of "0". The determination device determines reliability of a bit as "0" in a case where an absolute value of the posteriori value is equal to or less than θ, and determines the reliability of the bit as "1" in the other cases. Here, θ is a threshold value that is set in advance, and a different value may be used in accordance with the number of decoding failure pages. A method of determining θ will be described later.

The posteriori value is not limited to the LLR, and a posteriori probability of a bit of "0" or "1" may be used, for example. In this case, for example, in a case where the posteriori probability is within a range of ±θ on the basis of 0.5 (the central value of the posteriori probability), reliability of a bit is determined as "0", and the reliability of the bit is determined as "1" in other cases.

In addition, the reliability is not limited to the example in which the reliability is expressed by one bit. For example, a plurality of threshold values θ may be set, and the reliability may be expressed by a width of two or more bits. In this case, a bit with the predetermined threshold value or less is referred to as a bit with low reliability, and the other bits are referred to as bit with high reliability.

Next, an operation of the inter-page code decoder group 303 will be described. The inter-page code decoder group 303 restores the decoding failure page through inter-page decoding by setting an output of the in-page code decoder group 301 and an output of the reliability determination device group 302 as an input. In this embodiment, two kinds of decoding modes including decoding that does not use a reliability and decoding that uses the reliability can be selectively executed in accordance with the number of decoding failure pages in RAID composing pages, and in accordance with a use case.

Hereinafter, description will be given of an operation in a case of using an SPC code or an RS code in which the number of parity symbols p¬=2t (t is an integer of 1 or greater) as the inter-page code. Furthermore, a code length of the in-page code is set as n, the number of RAID composing pages is set as N, the number of decoding failure pages is set as e, and a j∈$n^{th}$ bit of an i∈$N^{th}$ page is set as $b_j^i$. Furthermore, one symbol is constituted by a plurality of bits (for example, eight bits).

(Example 1) SPC Code (1-1) Case of e=1 (XOR Decoding)

The decoder substitutes all bits in a decoding failure page with restoration bits that take exclusive OR of bits of all pages other than the decoding failure page. Specifically, when a page number of the decoding failure page is set as i∈N, the decoder restores a j∈$n^{th}$ bit by the following Expression (1).

$$b_j^i = b_j^1 \oplus b_j^2 \ldots \oplus b_j^{i-1} \oplus b_j^{i+1} \oplus \ldots \oplus b_j^N \qquad (1)$$

(1-2) Case of e>1 (Extended XOR Decoding)

The decoder substitutes low-reliability bits of a decoding failure page with restoration bits that take exclusive OR of bits of all pages other than the decoding failure page. Specifically, when a page number of the decoding failure page is set as i∈N, the decoder restores a j∈$n^{th}$ bit by the above Expression (1).

(Example 2) Case of RS Code (2-1) Case of 1≤e≤p (RS Decoding)

The decoder restores a decoding failure page through bounded distance decoding or erasure correction.

(2-2) Case of e>p (Bounded Distance Decoding)

The decoder restores a decoding failure page through bounded distance decoding. With regard to respective frames of an inter-page code, decoding succeeds with respect to frames in which the number of error symbols is p/2 or less. However, in a case where the number of bits that are flipped (corrected) through decoding exceeds a threshold value determined in advance, correction may be rejected.

(2-3) Case of e>p (Extended RS Decoding)

In this case, decoding is executed through bounded distance decoding or erasure correction of an RS code by setting a symbol selected on the basis of reliability as an error-detected symbol. For example, any one of the following three methods is applicable.

(Method 1)

With respect to respective frames of the inter-page code, q pieces of symbols (q is a natural number of 1 to p) among symbols included in e pieces of decoding failure pages are regarded as an error position, and RS decoding is performed. Here, $_eC_q$ pieces of test patterns for performing the RS decoding exist. Furthermore, as "q", not only one kind but also a plurality of kinds may be used. The sum of reliability of bits that are flipped in the RS decoding with respect to respective test patterns is set as a parameter, and a set of error positions with respect to a test pattern in which the sum of reliability becomes minimum is employed as a correction result. However, in a case where the sum of the reliability exceeds a threshold value that is determined in advance, and in a case where a low-reliability bit is not flipped, correction may be rejected.

(Method 2)

With respect to respective frames of the inter-page code, in a case where the number of symbols including a low-reliability bit among e pieces of decoding failure pages is q (q is a natural number of 1 to p), the q pieces of symbols are regarded as an error position, and the RS decoding is performed. In a case where the number of bits flipped in the RS decoding exceeds a threshold value that is determined in advance, and in a case where the sum of the reliability of the flipped bits exceeds a threshold value that is determined in advance, correction may be rejected. When the number of symbols including a low-reliability bit is less than q, whether or not to perform the RS decoding may be selectively determined. For example, whether or not to perform the RS decoding may be determined in advance. When the number of symbols including a low-reliability bit is greater than q, the RS decoding is not executed.

(Method 3)

With respect to respective frames of the inter-page code, higher q pieces of symbols (q is a natural number of 1 to p) including a lot of low-reliability bits among e pieces of decoding failure pages are regarded as an error position, and the RS decoding is performed. However, in a case where the number of bits flipped in the RS decoding exceeds a threshold value that is determined in advance, and in a case where the sum of the reliability of the flipped bits exceeds a threshold value that is determined in advance, correction may be rejected. In a case where a plurality of symbols, in which the number of low-reliability bits is the same, exist, for example, any one among the plurality of symbols is selected in accordance with a rule that is determined in advance. For example, a rule that a symbol included in a decoding failure page with a small page number is preferentially selected can be used.

The inter-page code is not limited to the SPC code or the RS code, and may be other codes such as the BCH code, for example. Even in the other codes, a bit position of which an error probability is high may be estimated in accordance with reliability, and decoding (extended decoding) in which the estimated position is regarded an error position may be executed.

In the case of e>p, which of the bounded distance decoding and the extended RS decoding is to be used is determined according to, for example, a condition that is determined in advance. For example, in a case where the number of times of repetitive decoding reaches a threshold value that is determined in advance, the extended RS decoding is executed, and in a case where the number of times of repetitive decoding does not reach the threshold value, the bounded distance decoding may be executed.

Next, description will be given of a method of determining the threshold value $\Delta$ that is used in reliability determination. As described above, the reliability determination device group 302 compares the soft-decision read value or the posteriori value with a threshold value that is set in advance to determine reliability. Here, description will be given of a method of determining a threshold value for enhancing overall reliability of the RAID system in a case of using the SPC code as the inter-page code. Furthermore, although in the following description, the threshold value is noted as $\Delta$ on the assumption of reliability determination using the soft-decision read value, with respect to reliability determination using the posteriori value, completely the same argument can be made by substituting $\Delta$ with $\theta$.

A bit error rate (BER) of a decoding failure page is set as $BER_f$. In addition, with respect to respective bits of the decoding failure page, a probability of determination as a low-reliability bit when performing soft-decision read with the threshold value $\Delta$ is set as $\alpha_f(\Delta)$. In addition, a BER of a bit determined as a low-reliability bit is set as $BER_{U_f}(\Delta)$. In addition, a BER of a bit determined as a high-reliability bit is set as $BER_{R_f}(\Delta)$. At this time, $BER_f$ is expressed by the following Expression (2).

$$BER_f = \alpha_f(\Delta) \cdot BER_{U_f}(\Delta) + (1 - \alpha_f(\Delta)) \cdot BER_{R_f}(\Delta) \quad (2)$$

Next, consideration will be given to a BER of "value taking XOR of all pages other than a decoding failure page". At this time, when assuming that (e−1) pages other than the page fail in decoding, a BER of a restoration bit becomes $\frac{1}{2}\{1-(1-2BER_f)^e\} \approx e \times BER_f$. Here, a relationship of $BER_f \ll 1$ is assumed. Accordingly, when substituting the low-reliability bit with the restoration bit, the BER can be expressed by the following Expression (3).

$$BER_c(\Delta,e) = \alpha_f(\Delta) \cdot e \cdot BER_f + (1-\alpha_f(\Delta)) \cdot BER_{R_f}(\Delta) \quad (3)$$

Accordingly, when the threshold value $\Delta$ is determined by the following Expression (4), the BER of the restoration page becomes minimum, and thus it is possible to maximize overall reliability of the RAID system. Here, $\arg_\Delta \min\{f(\Delta)\}$ represents $\Delta$ that minimizes $f(\Delta)$.

$$\Delta(e) = \arg_\Delta \min\{BER_c(\Delta,e)\} \quad (4)$$

The right-hand side of Expression (3) can be specifically obtained by assuming a model of an error that occurs in a nonvolatile memory or by experimentally taking data. Accordingly, an optimal threshold value can be determined in advance through offline evaluation.

Next, description will be given of a method of determining the threshold value $\Delta$ in a case where the number of decoding failures of the entirety of pages that compose the RAID is not clear. As described above, the BER when substituting the low-reliability bit of the decoding failure page with the restoration bit can be expressed by Expression (3). At this time, when a decoding method that is used in the in-page code decoder group 301 is determined, a decoding failure probability of the restoration page is also determined. A frame error rate (FER) at this time is expressed by $FER_c(\Delta,e)$. In addition, a probability that (e−1) pages other than the page fail in decoding is set as $P(e)$. At this time, the threshold value $\Delta$ is determined by the following Expression (5). When using the threshold value $\Delta$, the BER of the restoration page becomes minimum, and thus it is possible to maximize overall reliability of the RAID system.

$$\Delta = \arg_\Delta \min\{\Sigma_{e=1}^{N-1} P(e) FER_c(\Delta,e)\} \quad (5)$$

Figure 6:
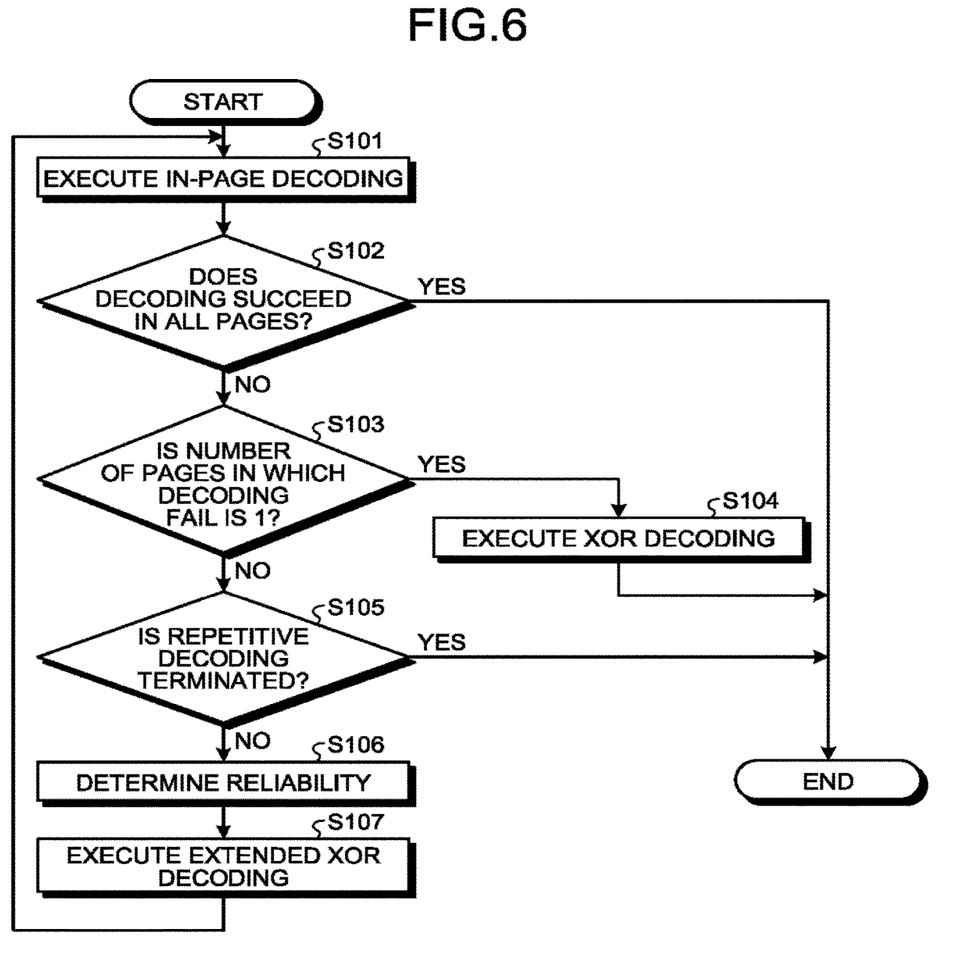
FIG. 6 is a flowchart illustrating an example of decoding processing in a case where an inter-page code is set as an SPC.

Next, description will be given of decoding processing by the memory system 1 according to this embodiment. FIG. 6 is a flowchart illustrating an example of decoding processing in a case where the inter-page code is set to the SPC code.

First, the in-page code decoder group 301 executes in-page decoding (Step S101). The in-page code decoder group 301 determines whether or not the in-page decoding succeeds in all pages (Step S102). In a case of success (Step S102: Yes), the decoding processing is terminated.

In a case where the in-page decoding does not succeed in some pages (Step S102: No), the inter-page code decoder group 303 determines whether or not the number of pages in which decoding fail is "1" (Step S103). In a case of "1" (Step S103: Yes), the inter-page code decoder group 303 executes XOR decoding described in (Example 1) (Step S104), and the decoding processing is terminated.

In a case where the number of pages in which decoding fail is not "1" (Step S103: No), the inter-page code decoder group 303 makes a determination as to whether or not to terminate repetitive decoding (Step S105). For example, in a case where the number of times of repetitive decoding reaches the upper limit that is set in advance, the inter-page code decoder group 303 determines that the repetitive decoding is terminated.

In a case where it is determined that the repetitive decoding is terminated (Step S105: Yes), the decoding processing is terminated. In a case where it is determined that the repetitive decoding is continued (Step S105: No), the reliability determination device group 302 determines reliability of respective bits of the decoding failure page (Step S106). Next, the inter-page code decoder group 303 executes extended XOR decoding described in (Example 1) (Step S107). Thereafter, the processing returns to Step S101 and is repeated.

Figure 7:
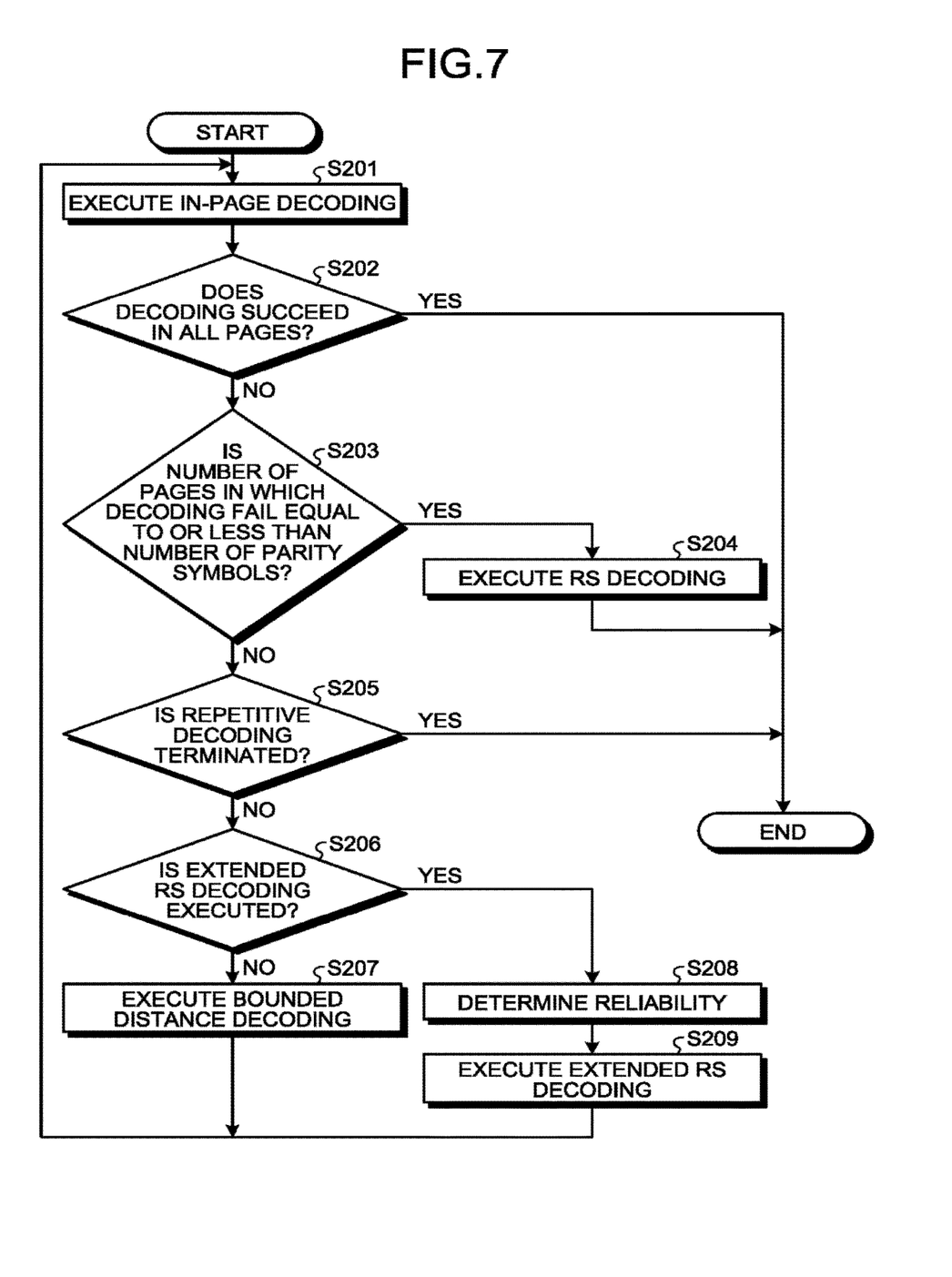
FIG. 7 is a flowchart illustrating an example of the decoding processing in a case where the inter-page code is set as an RS.

FIG. 7 is a flowchart illustrating an example of the decoding processing in a case where the inter-page code is set to the RS code. Steps S201 and S202 are the same as Steps S101 and S102 in FIG. 6, and thus description thereof will be omitted.

In a case where the in-page decoding does not succeed in some pages (Step S202: No), the inter-page code decoder group 303 determines whether or not the number of pages in which decoding fail is equal to or less than the number of parity symbols (Step S203). In a case where the number of pages in which decoding fail is equal to or less than the number of parity symbols (Step S203: Yes), the inter-page code decoder group 303 executes the RS decoding described in (Example 2) (Step S204), and the decoding processing is terminated.

In a case where the number of pages in which decoding fail is greater than the number of parity symbols (Step S203: No), the inter-page code decoder group 303 determines whether or not to terminate the repetitive decoding (Step S205). For example, in a case where the number of times of repetitive decoding reaches the upper limit that is set in advance, the inter-page code decoder group 303 determines that repetitive decoding is terminated.

In a case where it is determined that the repetitive decoding is terminated (Step S205: Yes), the decoding processing is terminated. In a case where it is determined that the repetitive decoding is continued (Step S205: No), the inter-page code decoder group 303 determines whether or not to execute the extended RS decoding described in (Example 2) (Step S206). For example, the inter-page code decoder group 303 determines that the extended RS decoding is executed in a case where the number of times of repetitive decoding is equal to or greater than a threshold value that is set in advance, and the bounded distance decoding is executed in the other case.

In a case where it is determined that the extended RS decoding is not executed (Step S206: No), the inter-page code decoder group 303 executes the bounded distance decoding described in (Example 2) (Step S207). In a case where it is determined that the extended RS decoding is executed (Step S206: Yes), the reliability determination device group 302 determines reliability of respective bits of the decoding failure page (Step S208). Next, the inter-page code decoder group 303 executes the extended RS decoding described in (Example 2) (Step S209).

After Step S207 and Step S209, the processing returns to Step S201 and is repeated.

Figure 8:
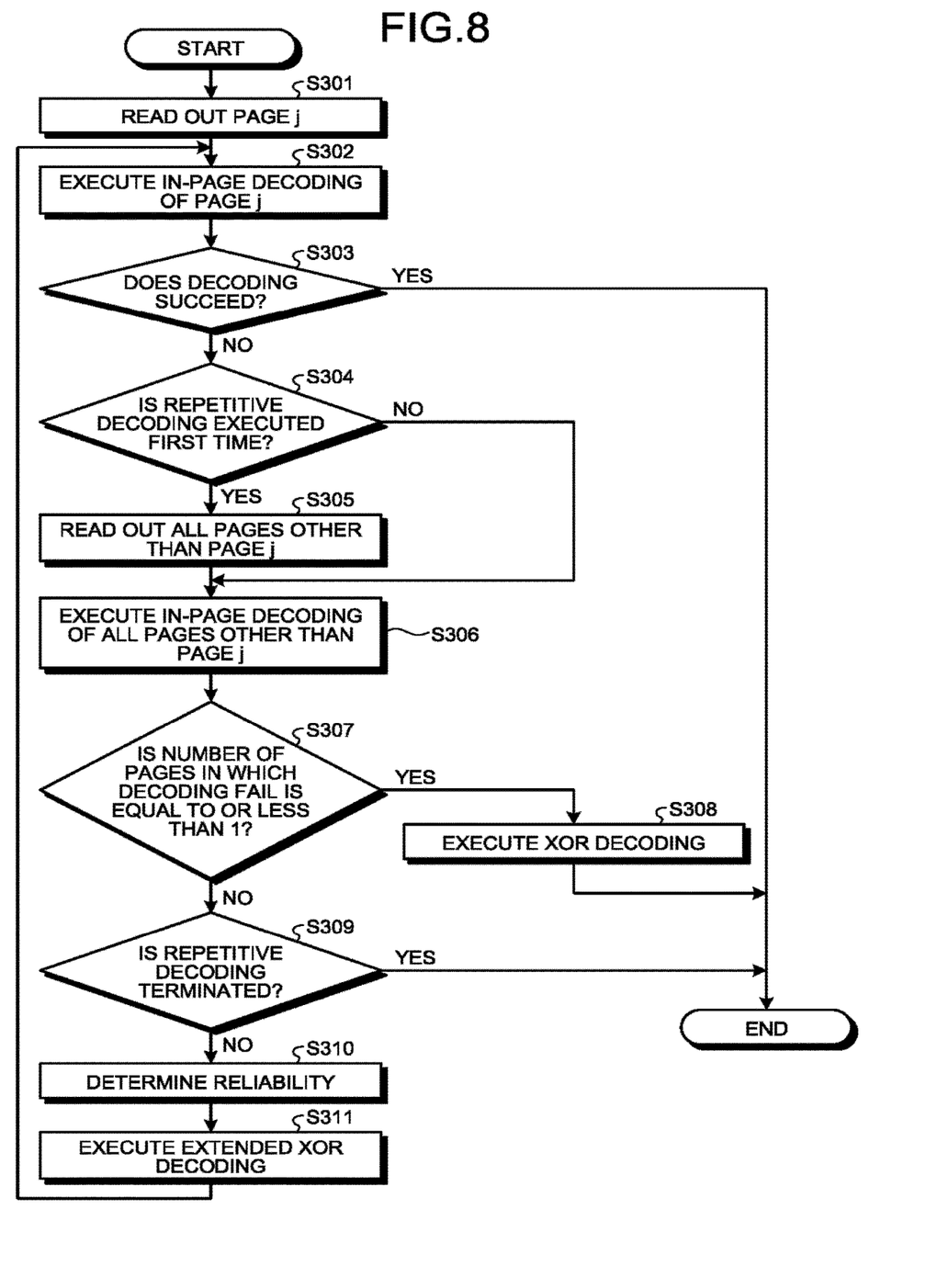
FIG. 8 is a flowchart illustrating an example of the decoding processing in a case where the inter-page code is set as the SPC.
Figure 9:
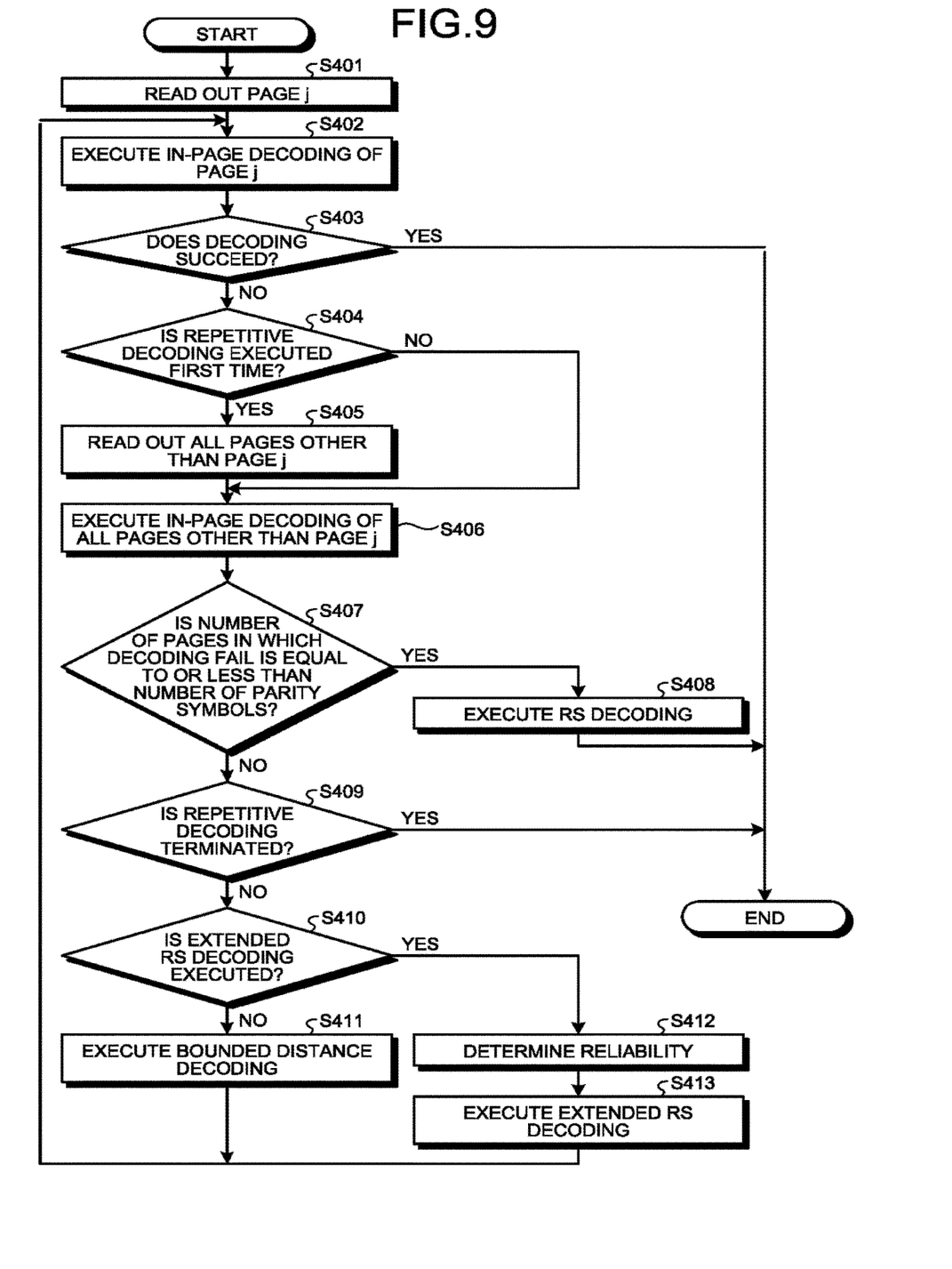
FIG. 9 is a flowchart illustrating an example of the decoding processing in a case where the inter-page code is set as the RS.

FIG. 6 and FIG. 7 illustrate an example of decoding processing in a case of decoding all pages. It is not necessary for decoding processing of all pages to be collectively executed, and only a specific page may be decoded. FIG. 8 and FIG. 9 illustrate an example of decoding processing in this case. FIG. 8 is a flowchart illustrating an example of decoding processing in a case where the inter-page code is set to the SPC code.

First, the in-page code decoder group 301 acquires a read value of a page j for which decoding is executed (Step S301). The in-page code decoder group 301 executes the in-page decoding with respect to the page j (Step S302). The in-page code decoder group 301 determines whether or not the in-page decoding succeeds (Step S303). In a case of success (Step S303: Yes), the decoding processing is terminated.

In a case where the in-page decoding does not succeed (Step S303: No), the inter-page code decoder group 303 determines whether or not it is the first time of the repetitive decoding (Step S304). In a case of the first time (Step S304: Yes), the in-page code decoder group 301 acquires read values of all pages other than the page j (Step S305).

After acquisition of the read values of the all pages, or in a case where it is determined that it is not the first time of the repetitive decoding (Step S304: No), the in-page code decoder group 301 executes the in-page decoding of all pages other the page j (Step S306).

The inter-page code decoder group 303 determines whether or not the number of pages in which decoding fail is 1 or less (Step S307). In a case of 1 or less (Step S307: Yes), the inter-page code decoder group 303 executes XOR decoding described in (Example 1) (Step S308), and the decoding processing is terminated.

In a case where the number of pages in which decoding fail is greater than 1 (Step S307: No), the inter-page code decoder group 303 determines whether or not to terminate repetitive decoding (Step S307). In a case where it is determined that the repetitive decoding is terminated (Step S307: Yes), the decoding processing is terminated. In a case where it is determined that the repetitive decoding is continued (Step S307: No), the reliability determination device group 302 determines reliability of respective bits of the decoding failure page (Step S308). Next, the inter-page code decoder group 303 executes extended XOR decoding described in (Example 1) (Step S311). Next, the processing returns to Step S301 and is repeated.

FIG. 9 is a flowchart illustrating an example of decoding processing in a case where the inter-page code is set to the RS code. Steps S401 to S406 are the same as Steps S301 to S306 in FIG. 8, and thus description thereof will be omitted. In addition, Step S407 to Step S413 are the same as Step S203 to Step S209 in FIG. 7, and thus description thereof will be omitted.

Figure 10:
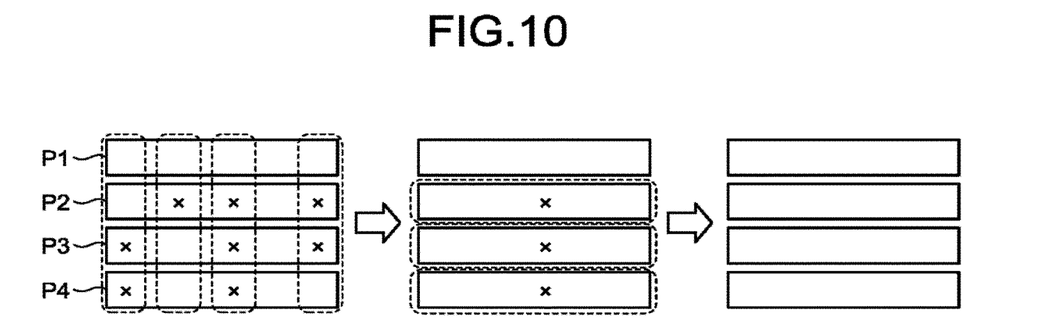
FIG. 10 is a view illustrating a specific example of repetitive decoding according to this embodiment.

FIG. 10 is a view illustrating a specific example of the repetitive decoding according to this embodiment. FIG. 10 illustrates an example of a decoding result when sequentially executing in-page decoding, inter-page decoding, and in-page decoding with respect to four pages of P1 to P4. A left decoding result in FIG. 10 represents that only the page P1 succeeds in decoding through the in-page decoding and the other three pages fail in decoding. "x" represents a bit that is determined as a low-reliability bit by a determination device. A site surrounded by a broken line in the left decoding result in FIG. 10 represents a data unit that becomes a target of the subsequent inter-page decoding. A site surrounded by a broken line in a central decoding result in FIG. 10 represents a page that becomes a target of the subsequent in-page decoding.

For example, in a case where an RS code in which the number of parity symbols is "1" is set as the inter-page code, in this embodiment, it is also possible to decode left-end and right-end frames that include two low-reliability bits through the extended RS decoding. The central decoding result in FIG. 10 represents a decoded state as described above. Thereafter, when the in-page decoding is repeated, it is possible to correct all errors (a right decoding result in FIG. 10).

As described above, in this embodiment, it is possible to enhance reliability of a memory system in which pieces of data that compose the RAID by using a plurality of pages protected by the ECC are written. For example, in a case of composing the RAID by using the SPC code, even in a case where decoding fails in two or more pages, it is possible to perform correction by applying this embodiment to the case.

In addition, for example, in a case of composing the RAID by using the RS code in which the number of parity symbols is two, even in a case where decoding fails in three or more pages, it is possible to correct two symbol errors included in respective frames of the RS code when applying this embodiment to the case. According to this, it is possible to enhance performance of in-page encoding and repetitive decoding in the RAID.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system, comprising:
a nonvolatile memory; and
a memory controller,
wherein the nonvolatile memory includes a plurality of first storage regions,
each of the first storage regions includes a plurality of second storage regions,
each of the second storage regions is a unit of data writing and a unit of data reading,
each of pieces of first data includes pieces of second data as storage target data,
third data includes the pieces of the second data that are selected one by one from each of the pieces of the first data,
the pieces of the second data that are included in the third data do not overlap the pieces of the second data that are included in another piece of third data, and
the memory controller configured to,
execute first decoding of decoding each of the pieces of the first data on the basis of a first error correcting code generated by using the first data,
calculate first reliability of each bit in each of the second storage regions that fail in the first decoding, the first reliability being calculated by using a read value that is read from the nonvolatile memory by executing a soft-decision read, and
execute second decoding of decoding the third data that includes one or more low reliability bits on the basis of a second error correcting code that is generated by using the third data, each of the low reliability bits being a bit of which the first reliability is less than second reliability of other bits of the third data.

2. The memory system according to claim 1, wherein the soft-decision read is executed by using a soft-decision read level that is different from a hard-decision read level used in a hard-decision read.

3. The memory system according to claim 2, wherein the soft-decision read is executed by using the soft-decision read level that is different in accordance with a number of failure regions, the failure regions being the second storage regions that fail in the first decoding.

4. The memory system according to claim 1, wherein the first error correcting code is a single parity check (SPC) code,
in a case where a number of failure regions is "1", the memory controller is configured to substitute all bits in the failure region with restoration bits that take exclusive OR with bits of all pages other than the failure region, the failure regions being the second storage regions that fail in the first decoding, and
in a case where a number of the failure regions is 2 or greater, the memory controller is configured to substitute the low reliability bits included in the failure regions with the restoration bits that take exclusive OR of the bits of all pages other than the failure regions.

5. The memory system according to claim 4, wherein the memory controller is configured to repetitively execute decoding by the first error correcting code and decoding by the second error correcting code.

6. The memory system according to claim 1, wherein the first error correcting code is a reed solomon (RS) code,
in a case where a number of failure regions is equal to or less than a number of parity symbols of the RS code, the memory controller is configured to execute decoding through bounded distance decoding or erasure correction of the RS code, the failure regions being the second storage regions that fail in the first decoding, and
in a case where the number of the failure regions is greater than the number of the parity symbols of the RS code, the memory controller is configured to execute decoding through bounded distance decoding or erasure correction of the RS code by setting a symbol selected on the basis of the first reliability as an error-detected symbol.

7. The memory system according to claim 6, wherein the memory controller is configured to repetitively execute decoding by the first error correcting code and decoding by the second error correcting code.

8. The memory system according to claim 6, wherein in a case where the number of the failure regions is greater than the number of the parity symbols of the RS code, the memory controller is configured to select q pieces of symbols from symbols included in the failure region in a plurality of patterns different from each other, execute decoding through bounded distance decoding or erasure correction of an RS code by setting the selected symbol as an error-detected symbol, and output a decoding result corresponding to a pattern of which the sum of the first reliability of bits changed by the decoding is smaller in comparison to other patterns, q being a natural number equal to or greater than 1 and equal to or less than the number of the parity symbols.

9. The memory system according to claim 6, wherein
each of the low reliability bit is a bit of which the first reliability is less than a threshold value determined in advance, and
in a case where the number of the failure regions is greater than the number of the parity symbols of the RS code, and where the number of symbols including the low reliability bits is q in the failure region, the memory controller is configured to execute decoding through bounded distance decoding or erasure correction of an RS code by setting q pieces of symbols including the low reliability bits as an error-detected symbol, q being a natural number equal to or greater than 1 and equal to or less than the number of the parity symbols.

10. The memory system according to claim 6,
wherein
each of the low reliability bit is a bit of which the first reliability is less than a threshold value determined in advance, and
in a case where the number of the failure regions is greater than the number of the parity symbols of the RS code, the memory controller is configured to select q pieces of symbols in which the number of the low reliability bits is greater in comparison to other symbols in the failure region, and execute decoding through bounded distance decoding or erasure correction of an RS code by setting the selected symbols as an error-detected symbol, q being a natural number equal to or greater than 1 and equal to or less than the number of the parity symbols.

11. A method of controlling a nonvolatile memory,
the nonvolatile memory including a plurality of first storage regions,
each of the first storage regions including a plurality of second storage regions,
each of the second storage regions being a unit of data writing and a unit of data reading,
each of pieces of first data including pieces of second data as storage target data,
third data including the pieces of the second data that are selected one by one from each of the pieces of the first data,
the pieces of the second data that are included in the third data not overlapping the pieces of the second data that are included in another piece of third data, the method comprising:
executing first decoding of decoding each of the pieces of the first data on the basis of a first error correcting code that is generated by using the first data;
calculating first reliability of each bit in each of the second storage regions that fail in the first decoding, the first reliability being calculated by using a read value that is read from the nonvolatile memory by executing a soft-decision read; and
executing second decoding of decoding the third data that includes one or more low reliability bits on the basis of a second error correcting code that is generated by using the third data, each of the low reliability bits being a bit of which the first reliability is less than second reliability of other bits of the third data.

12. The method according to claim 11,
wherein the soft-decision read is executed by using a soft-decision read level that is different from a hard-decision read level used in a hard-decision read.

13. The method according to claim 12,
wherein the soft-decision read is executed by using the soft-decision read level that is different in accordance with a number of failure regions, the failure regions being the second storage regions that fail in the first decoding.

14. The method according to 13,
wherein the first error correcting code is a single parity check (SPC) code,
in a case where a number of failure regions is "1", all bits in the failure region are substituted with restoration bits that take exclusive OR with bits of all pages other than the failure region, the failure regions being the second storage regions that fail in the first decoding, and
in a case where a number of the failure regions is 2 or greater, the low reliability bits included in the failure regions are substituted with restoration bits that take exclusive OR of the bits of all pages other than the failure regions.

15. The method according to claim 14,
wherein decoding by the first error correcting code and decoding by the second error correcting code are repetitively executed.

16. The method according to claim 11,
wherein the first error correcting code is a reed solomon (RS) code,
in a case where a number of failure regions is equal to or less than a number of parity symbols of the RS code, decoding is executed through bounded distance decoding or erasure correction of the RS code, the failure regions being the second storage regions that fail in the first decoding, and
in a case where the number of the failure regions is greater than the number of the parity symbols of the RS code, decoding is executed through bounded distance decoding or erasure correction of the RS code by setting a symbol selected on the basis of the first reliability as an error-detected symbol.

17. The memory system according to claim 1, wherein the first reliability is calculated by using the read value without executing a decoding processing.

* * * * *